United States Patent
Seabaugh

(10) Patent No.: US 6,201,258 B1
(45) Date of Patent: Mar. 13, 2001

(54) HOT CARRIER TRANSISTORS UTILIZING QUANTUM WELL INJECTOR FOR HIGH CURRENT GAIN

(75) Inventor: Alan Carter Seabaugh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/263,180

(22) Filed: Jun. 21, 1994

Related U.S. Application Data

(63) Continuation of application No. 07/954,611, filed on Sep. 30, 1992, now abandoned, which is a continuation of application No. 07/726,070, filed on Jul. 5, 1991, now abandoned, which is a continuation of application No. 07/567,847, filed on Aug. 15, 1990, now abandoned.

(51) Int. Cl.$^7$ .................................................. H01L 29/06
(52) U.S. Cl. ................................. 257/14; 257/26
(58) Field of Search ..................... 357/4, 16, 12, 357/34; 257/14, 26, 615, 183

(56) References Cited

U.S. PATENT DOCUMENTS 4,712,121 * 12/1987 Yokoyama .............................. 357/4

* cited by examiner

Primary Examiner—Mark V. Prenty
(74) Attorney, Agent, or Firm—Carlton H. Hoel; W. James Brady; Frederick J. Telecky, Jr.

(57) ABSTRACT

A quantum transistor (10) includes an emitter (38), an injector structure (36), a base (20) and a collector (16) coupled to the base. The injector (36) is interposed between the emitter (38) and the base (20). The injector structure (36) includes a quantum well (60) having a general conductance band minimum energy level. A notch (28) in the well (60) has a conductance band minimum energy level that is lower than the general level. This notch (28) is operable to lower the energy of electrons disposed in the quantum well (60). Therefore, the electrons resident in the well are injected through a barrier (24) into the base (20) at an energy level at or slightly above the base/collector barrier $\phi_{BC}$, but below the X or L energies such that intervalley scattering is reduced.

4 Claims, 4 Drawing Sheets

HOT CARRIER TRANSISTORS UTILIZING QUANTUM WELL INJECTOR FOR HIGH CURRENT GAIN

This application is a continuation of application Ser. No. 07/954,611 filed Sep. 30, 1992 and now abandoned, which is a continuation of application Ser. No. 07/726,070 filed Jul. 5, 1991 and now abandoned, which is a continuation of application Ser. No. 07/567,847, filed Aug. 15, 1990 and now abandoned.

TECHNICAL FIELD OF THE INVENTION

The present invention relates in general to hot carrier transistors and methods of manufacture therefor, and more particularly to hot carrier transistors utilizing quantum well injectors for high current gain.

BACKGROUND OF THE INVENTION

Unipolar hot-electron transistors (HETS) have received little attention when compared with the level of effort focused on bipolar transistors. The HET has long shown promise as a high frequency device, but its development has been impeded by stringent fabrication requirements, immature growth techniques, and the lack of design tools for optimizing electron-wavelength-scale devices.

In recent years, many of these difficulties have been surmounted. At 77K, resonant-tunneling hot-electron transistors (RHET) have been demonstrated with common emitter current gain on both gallium arsenide and indium phosphide substrates. See N. Yokoyama, et al., *Solid State Electronics* 31 (1988) 577.

In a conventional RHET, an injector structure is interposed between the emitter and the base. This injector structure includes a quantum well having a relatively low conductance band minimum electron energy level and a width that is on the order of an electron wavelength integer or half-integer multiple. The quantum well is bounded by high conductance band energy level barriers that are sufficiently thin that the electrons may tunnel through them. Electrons tunneling through the barrier from the emitter into the quantum well will resonate therein. The electron flux or current density passed through the quantum well will depend upon the energy of the electrons; electrons of certain energies will "couple" with the well better than others. Electrons resident in the quantum well are thus likely to be quasi-monoenergetic. These electrons are injected through the remaining barrier into the base.

However, the energy of injected electrons in conventional RHETs tends to be too high, and these electrons tend to be transferred from the lower-energy Γ mode to the X and L modes through internal scattering, then to be lost to the collector. Room-temperature gain for conventional RHETs has therefore been difficult to achieve.

To this date, only two instances of room temperature current gain in a HET have been reported: an InP-based RHET (T. Mori et al., *Extended Abstract of the Conf. of Solid State Devices and Materials* (1988) 507), and a device using AlGaAsSb heterojunctions (A. F. J. Levi and T. H. Chiu, *Applied Physics Lett.* 51 (1987) 985). However, no InP-based RHETS have been reported to operate with gain better than 2.5 at room temperature.

SUMMARY OF THE INVENTION

The present invention provides a quantum transistor having an emitter, an injector structure coupled to the emitter, a base coupled to the injector structure and a collector coupled to the base. The injector structure includes a quantum well having a general conductance band minimum energy level. At least one notch of the quantum well has a conductance band minimum energy level that is lower than the general energy level of the quantum well. This notch is operable to lower the energy of electrons disposed within the quantum well. A barrier having a relatively high conductance band minimum energy level is formed adjacent the quantum well and opposite the emitter, and allows the tunneling of electrons resident in the well across the barrier into the base. Because the notch in the quantum well is capable of lowering the energy of electrons injected by the injector structure into the base, these electrons are more available in contributing to the current gain of the device. Devices using the notched injector structure of the invention have exhibited a current gain in excess of 12 at room temperature.

In the preferred embodiment, the injector structure includes a second barrier interposed between the emitter and the quantum well, in which electrons resonate. The provision of a second barrier allows the injection of electrons into the base at one or more discrete energies and makes the operation of the transistor possible at more than two states.

In a particularly preferred embodiment, the transistor of the invention is built on an iron-doped indium phosphide substrate, and has an emitter, base and quantum well formed of indium gallium arsenide. The barriers of the injector structure are formed from aluminum arsenide, while the quantum well notch is formed of indium arsenide. The collector of the transistor is formed of indium aluminum gallium arsenide. The width of the well is preferably about 4 nanometers, with 2 nanometers of this being the notch. The width of the barriers is 1.5 nanometers, while a preferred width of the base is 40 nanometers.

Another aspect of the invention concerns a preferred method for manufacturing the transistor, in which the emitter/injector stack is recursively back-etched and tested until a resonant tunneling diode IV characteristic is obtained.

BRIEF DESCRIPTION OF THE DRAWINGS

Further aspects of the invention and their advantages will be discerned by reading the following detailed description of the invention when taken in conjunction with the appended drawings, in which like characters identify corresponding parts and in which.

DETAILED DESCRIPTION OF THE INVENTION

Figure 1:
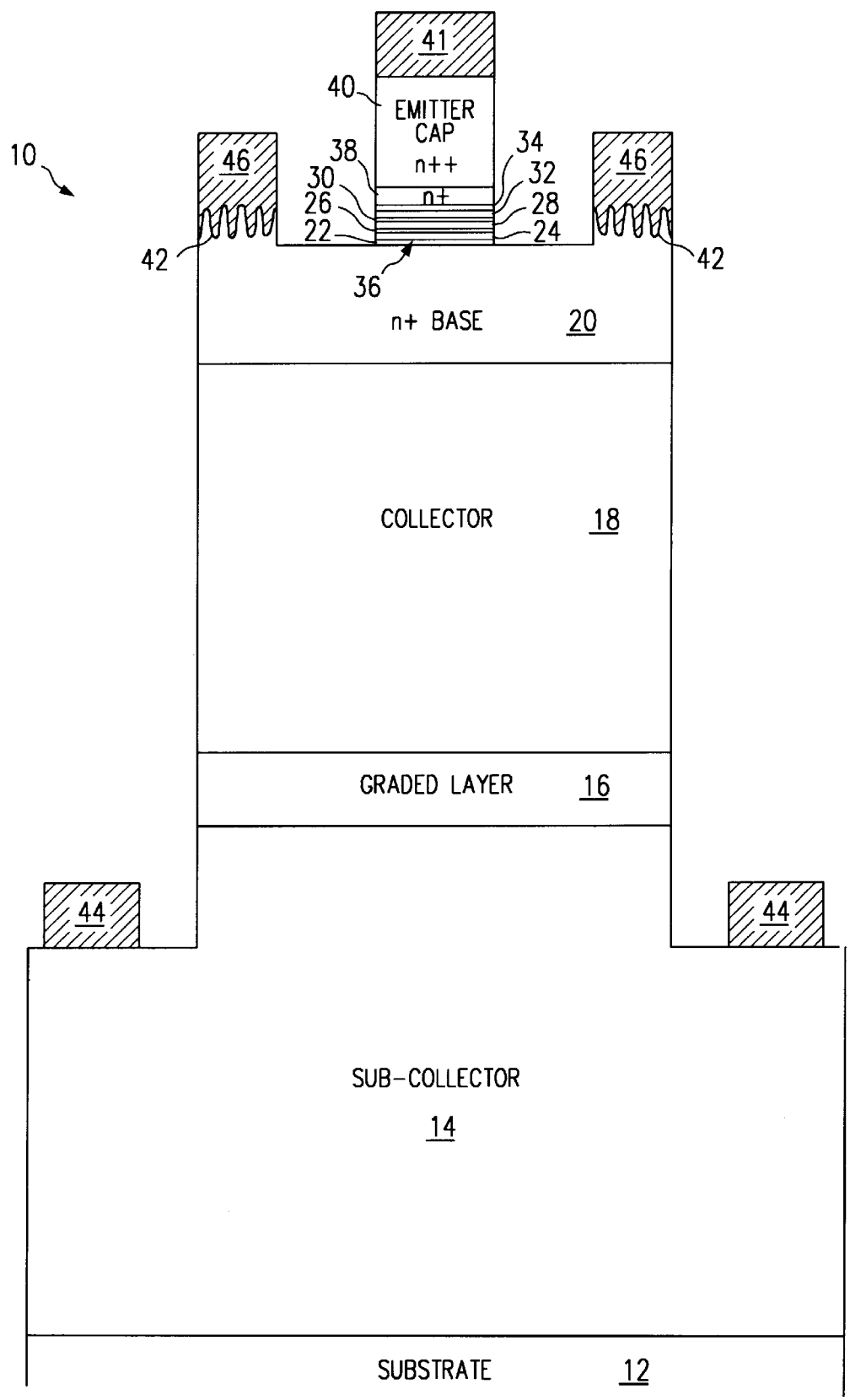
FIG. 1 is a schematic cross-sectional view of quantum resonating tunnel diode injector transistor fabricated according to the invention.

An exemplary physical embodiment of the device is shown in FIG. 1, which is a schematic cross-sectional view of a single resonant hot-electron transistor. This view is not to scale, certain dimensions having been greatly exaggerated or diminished for clarity. The transistor, indicated generally at 10, has in essence a vertical structure and is grown in the preferred embodiment on an indium phosphide substrate 12. Other possible substrates that can be used for the invention are silicon, gallium arsenide, indium arsenide, gallium antimonide and aluminum antimonide. The selection of the substrate material will determine the heterojunction systems that can be used, as these or their pseudomorphs must be lattice-matched to the substrate. This is especially true for the thicker layers (more than 10 nm or so) described below. The layer compositions given immediately below are for an InP-based system.

The transistor may be grown in successive layers in a reactor such as a Riber 2300 MBE. The iron-doped InP substrate is semi-insulating. A highly conductive subcollector layer 14 is grown on substrate 12. Subcollector 14 may be a ternary semiconductor such as indium gallium arsenide, and in a preferred embodiment is $In_{0.53}Ga_{0.47}As$, and is grown to a width of 550 nm.

A graded layer 16 is grown on the subcollector 14 to a thickness of 50 nanometers, and represents a transition between the subcollector 14 and a collector layer 18, which is next grown to a thickness of 300 nanometers on the workpiece. The collector 18 has a composition of $In_{0.5}(Al_{0.5}Ga_{0.5})_{0.5}As$, and is undoped, as is the graded layer 16. The composition of the graded layer 16 varies continuously between the chemical compositions of the subcollector 14 and the collector 18. The collector layer 18 is grown to a depth of 300 nanometers.

Subsequently, a base layer 20 is grown to a width (measured in a vertical direction) of 40 nanometers in a preferred embodiment. The base layer 20 is $In_{0.53}Ga_{0.47}As$ and is doped to a concentration of $1 \times 10^{18}$ cm$^{-3}$. The base width of 40 nanometers may be varied at least within the range of 10 to 60 nanometers, as operational transistors with these base widths have been fabricated by the inventor.

On top of the base 20 is grown a 1.5 nanometer, undoped spacer layer 22, also of $In_{0.53}Ga_{0.47}As$. There is then formed on top of the spacer layer 22, in succession, an AlAs barrier layer 24, undoped, grown to a thickness of 1.5 to 2 nanometers; a first well layer 26 formed of $In_{0.53}Ga_{0.47}As$ undoped, and grown to a width of one nanometer; a central notch 28 of undoped indium arsenide, grown to a width of two nanometers; a second well layer 30 similar in width and composition to well layer 26; a second aluminum arsenide barrier layer 32, 1.5 to 2 nanometers wide; and a 1.5 nanometer-wide spacer layer 34 that is formed of undoped $In_{0.53}Ga_{0.47}As$. Layers 22–34 together comprise a resonant tunneling diode (RTD) injector indicated generally at 36.

It is also possible to fabricate a transistor with only one aluminum arsenide barrier and still achieve room temperature current gain. According to this alternative, unillustrated embodiment, the emitter barrier 32 is omitted. This will cause the injector structure 36 to inject a stream of electrons into the base 20 having a broad band of energies, rather than only certain discrete energies as would be permitted by the resonant tunneling diode injector 36. In contrast, the illustrated embodiment has further utility in that electrons having two or more discrete energy states can be injected into the base, thus allowing the transistor to represent more than two states.

After completion of the RTD injector 36, there is grown an emitter layer 38 of $In_{0.53}Ga_{0.47}As$. The emitter layer 38 is grown to a width of 50 nanometers, and is doped (N+) to a concentration of $1 \times 10^{18}$ cm$^{-3}$. Completing the semiconductor structure is an emitter cap layer 40 grown of $In_{0.53}Ga_{0.47}As$ to a width of 300 nanometers and doped (N+) to a concentration of $1 \times 10^{19}$ cm$^{-3}$.

Once the semiconductor layers thus described have been grown, the emitter cap 40, emitter 38 and RTD structure 36 are patterned and the emitter metal 41 is deposited. The emitter metal 41 is patterned and etched, and is then used as a self-aligned mask for etching back to the surface of the base 20. Detection of when the etch is complete is performed by recursive testing of the IV characteristic between the emitter and the etch surface. When the resonant tunneling diode IV characteristic (described below) appears, the stack etch is complete. On the size scale represented by the given layer dimensions, the etch front is not planar. Typical surface undulation is on the order of 30 nm, as is indicated schematically by the base metal/semiconductor boundary 42. These undulations continue up to the emitter/injector structure, but have been replaced by a horizontal line in FIG. 1 for the purpose of clarity.

The etched structure and the base layer 20 are next patterned with photoresist and a nonalloyed base contact metal 46 is deposited. An etch is then performed to remove portions of base layer 20, collector 18, layer 16 and the subcollector layer 14, and to define its lateral limits in order to provide room for the collector contacts (described below). Metal (preferably unalloyed) collector contacts 44, and base contacts 46 are added to complete the functional components of the structure. Air-bridge interconnects (not shown) are used to connect contacts 41, 44 and 46 to points external to the device.

Figure 2:
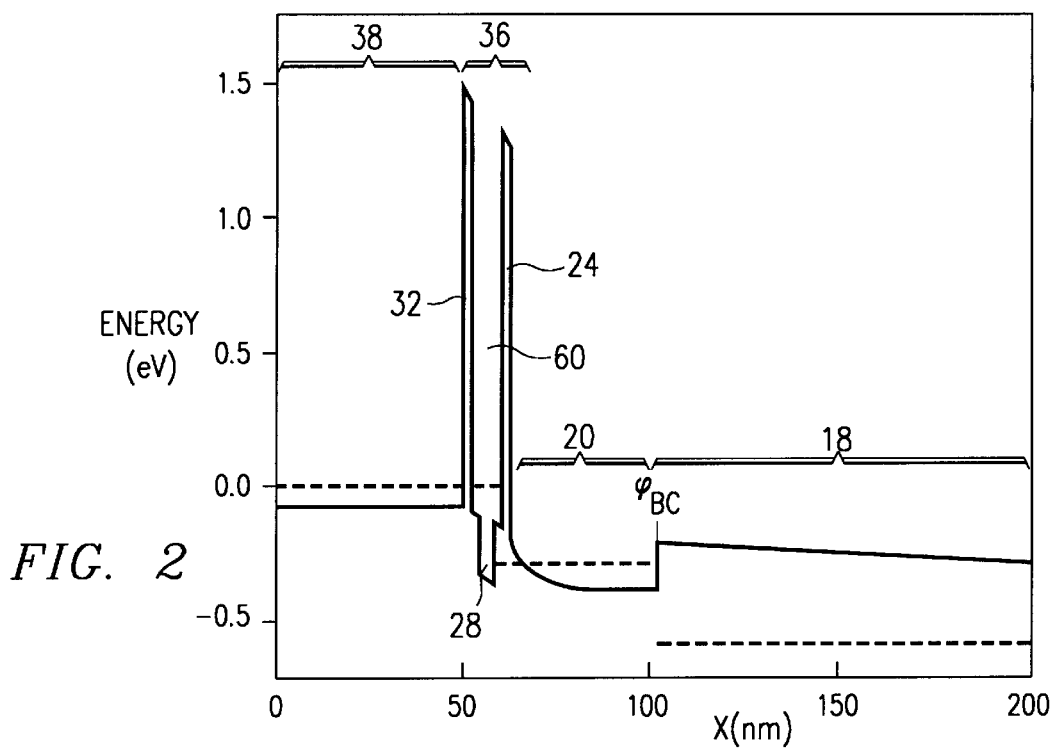
FIG. 2 is the Γ conductance band profile for the transistor shown in FIG. 1.

The energy band profile for the device constructed in FIG. 1 is shown in FIG. 2. The x-axis measures the distance in an emitter-collector direction, which is the same as the vertical direction in FIG. 1. The y-axis measures bandgap energy in electron volts. The $\Gamma$ conductance-band energy profile shown by the solid line is under a bias condition where $V_{BE}$ equals 0.3 volts and $V_{CB}$ equals 0.3 volts. The collector 18 is toward the right side of the graph, the emitter 38 on the left side, and the RTD injector 36 and base 20 are ranged in between. The emitter 38 joins a first energy barrier 32, on the opposite side of which there exists a quantum well 60. The quantum well 60 is bounded on the other side by a second energy barrier 24, itself adjacent to the base 20. Inside of the quantum well 60 is the notch 28.

Classically, an electron within emitter 38 having an energy $E_F$ and approaching the first energy barrier 32 with an energy below the barrier energy $E_B$ (here approximately 1.5 electron volts) would be reflected, analogous to a baseball rebounding off a concrete wall or to an electromagnetic wave at the end of an open-circuit transmission line. Quantum mechanics, however, allows that as the physical dimensions of the barrier decrease toward the wavelength of the particle, there is an increasing probability that the particle will be transmitted instead of reflected. Thus under certain conditions an electron can pass through the barrier even with energy below the barrier potential. This classically-forbidden phenomenon is called tunneling.

Having been transmitted through the first tunnel barrier 32, the electron finds itself in the quantum well 60. When the quantum well width is approximately equal to some integer or half-integer multiple of the electron wavelength, a standing wave can be built up by constructive interference, analogous to the standing waves in a microwave cavity. Thus, there will be certain wavelengths which will couple into and out of the quantum well 60 more readily than others.

The electron energy, E, and its wavelength, λ, are inversely related by the equation, $E=h^2/2m\lambda^2$, where h is Planck's constant and m is the effective electron mass. Since the electron's energy can be controlled by adjusting the bias across the structure, the transmission through the double barrier 32, 24 depends sensitively on the applied voltage. One can think of the double-barrier structure as an energy bandpass filter which transmits electrons most readily for certain applied biases, and reflects the electrons of other applied biases. The electron is said to be in resonance when the incoming electron energy matches the resonant transmission energy of the quantum-well structure, $E_W$.

The resonant tunneling diode injector 36 is thus operable to transmit electrons having energies around the resonant transmission energy of the quantum-well structure, $E_W$, to the base 20.

The energy of electrons to be injected into the base 20 is chosen to be less than the L and X intervalley transfer energies, both of which are greater than the Γ energy band profile given in FIG. 2. The injection energy should however be at an energy just greater than the base/collector barrier, $\phi_{BC}$. To achieve this condition, one must use thin tunnel barriers 32 and 24 and spacer layers 34 and 22 to minimize the voltage drop across the injector 36. See FIG. 1.

Even with thin tunneling barrier and space layers, a simple RTD injector such as AlAs/In$_{0.53}$Ga$_{0.47}$As/AlAs has a base injection energy significantly above $\phi_{BC}$. The width of the well 60 can be increased to energetically lower the n=1 resonance, thus lowering the injection energy. However, this approach results in an undesirable decrease in peak-current density, $J_P$, and peak-to-valley current ratio (PVR).

An alternative way to reduce the n=1 state energy is to incorporate a low bandgap layer within the quantum well, as recently demonstrated by Broekaert et al., *Appl. Phys. Lett.* 53 (1988) 1545. Using an RTD injector 36 with an InAs notch 28 in the center of the quantum well 60, a low base injection energy can be designed while still maintaining high PVR and $J_P$. This low base injection energy is related to the ground state of the notch 28.

The energy band profile shown in FIG. 2 is for a 40-nanometer base device describe in conjunction with FIG. 1. The profile shown in FIG. 2 is obtained from a self-consistent zero-current solution of Poisson's equation. Transmission resonances, shown by dashed lines in FIG. 2, are computed self-consistently from the potential profile. The notch 60 allows electrons to be injected into the base at energies at or slightly above $\phi_{BC}$. This is an advantage over the prior art, where the realizable injection energies were too high, permitting electrons to scatter into the X or L bands. Because of the existence of notch 60 and the ability to inject electrons into the base at lower energies, the electrons are not subsequently lost to the collector and room temperature gain is achieved.

FIG. 2 illustrates an application of the invention involving conductance-band tunneling. A corresponding P-type structure may also be fabricated where valence-band tunneling is used. An InP-based system may be employed to accomplish this, with the conductivity types of emitter cap 40, emitter 38 and base 20 being changed by doping to (p) type. To take into account the heavier effective mass of the "hole" as compared with the electron, the widths of the barriers 32 and 24, well 60 and notch 28 would have to be changed.

While the preferred embodiment employs an InAs substrate lattice-mismatched pseudomorph as the notch 28, lattice-matched compounds for well 60/notch 28 such as InGaAs/GaAs can be used instead. Indeed, the present invention is not limited to InP-based substrates, but can be constructed on a variety of substrates as above described. For example, an antimonide system (AlGaSb on InSb) can be used. Once a substrate is chosen, the other semiconductor materials are chosen for at least approximate lattice compatibility and for their exhibition of the illustrated bandgap differences in relation to each other. A transistor according to the invention may be built, for example, with AlGaAsSb compounds, CaF$_2$/Si/SiGe heterojunctions, or InGaAlAs compounds lattice-matched to a GaAs substrate. In the CaF$_2$/Si/SiGe system, CaF$_2$ would form the barriers 32 and 24, Si would form well 60 and SiGe (or even pure Ge) would form notch 28.

Nor is the present invention limited to one notch 28. Where one wishes to lower the electron energy even further, notch 28 is made wider. However, at least with a strained pseudomorphic notch, 3 nm is about the upper limit on notch width. To circumvent this problem, two or more notches may be placed within well 60, and these will have the effect of one wider notch. Repetition of notches 28 and well layers 26,30 can be made until one obtains a finite period superlattice of period 2 for the well/notch structure.

DC Characteristics

A principal advantage of the invention is the achievement of large (>3) room temperature gain. This current gain was achieved for three widths of base 20:10 nanometers, 40 nanometers and 60 nanometers. The physical geometry of the tested devices and polarity of applied biases preclude the possibility that the transistors operate in either a bipolar or field-effect transistor mode.

Figure 3A:
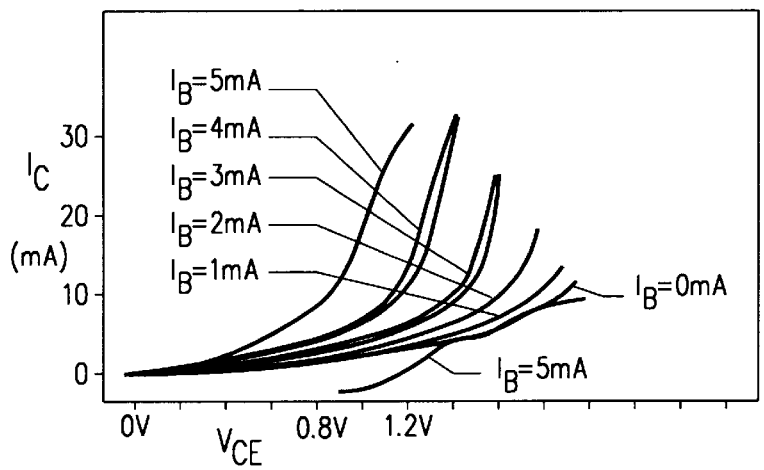
FIG. 3a is a graph of the room temperature common emitter transistor characteristic for a transistor fabricated according to the invention, collector current being plotted against collector-emitter voltage for five base current steps.
Figure 3B:
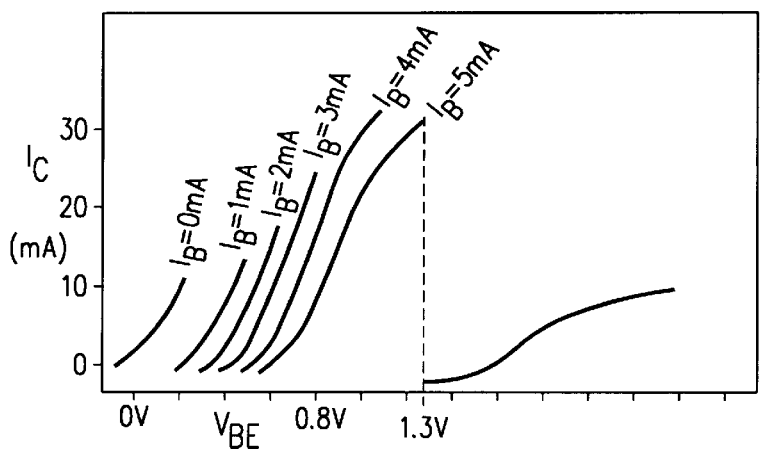
FIG. 3b is a graph of a set of $I_c$-$V_{BE}$ characteristics for the same transistor and base current steps for which the data for FIG. 3a were derived.

Common emitter transistor characteristics of the illustrated 40 nanometer device for five base current steps are shown in FIGS. 3a and 3b. Collector/base leakage gives rise to a non-zero collector current, $I_C$, for the first base current step, corresponding to $I_B$=0. For the fifth base current step, $I_B$=5 mA, the collector current is discontinuous at $V_{CE}$=1.2 volts. This is the point at which the RTD injector 36 (FIGS. 1 and 2) passes through resonance. Gain at resonance in this device exceeds 12 at a current density of $2.6 \times 10^4$ A/cm$^2$. Devices fabricated according to the invention are believed to be the first RHETs having a room-temperature gain above ten.

Referring to FIG. 3b, at $V_{BE}$=1.3 volts, the injector is switched out of resonance. When this occurs, the base/emitter voltage $V_{BE}$ increases, causing the collector/base junction to switch to a weak forward bias. This manifests itself as a negative collector current in the off-resonance condition and is seen in both FIGS. 3a and 3b. The collector current switches from a value of 5.3 mA at $V_{CE}$=1.2 volts to −0.3 mA at about a value of 0.9 volts due to this forward-biasing of the collector/base junction. The switching of $V_{BE}$ is a dynamic effect associated with the charging of the injector 36 during the curve tracer (TEKTRONIX 370) measurement, and is not observed in ramped DC measurements (See FIGS. 4a and 4b). At the resonance peak, the collector base voltage, $V_{CB}$, is nearly zero; therefore the current gain is not due to carrier multiplication in the base/collector junction.

Collector/base leakage gives rise to the non-zero collector currents seen most readily for the zero base current step. Cooling the device to 77K does not eliminate the leakage; however, on cooling to 4.2K, the leakage is significantly reduced. This suggests that the unintentional background doping density in the In(AlGa)As collector freezes out below 77K.

Figure 4A:
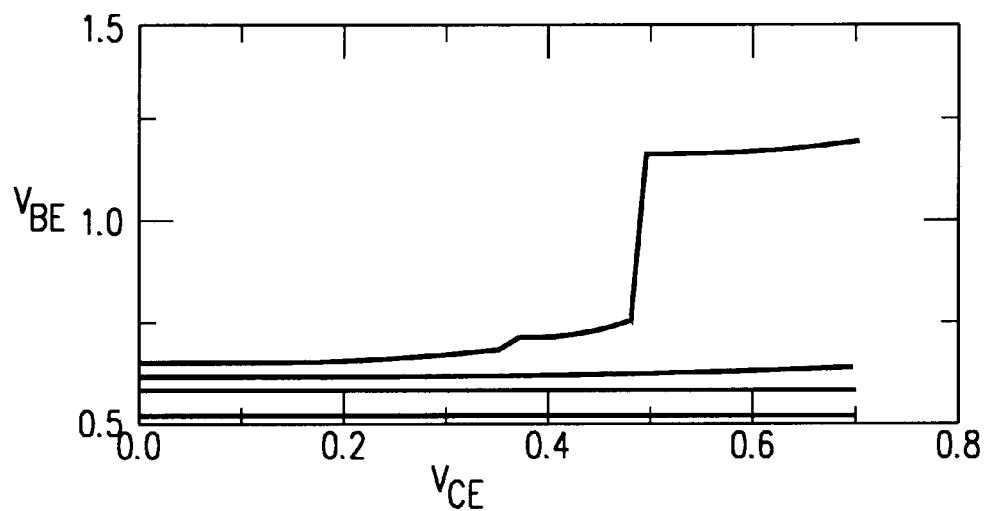
FIGS. 4a and 4b are graphs of the common-emitter characteristics at 4.2K for a transistor built according to the invention.
Figure 4B:
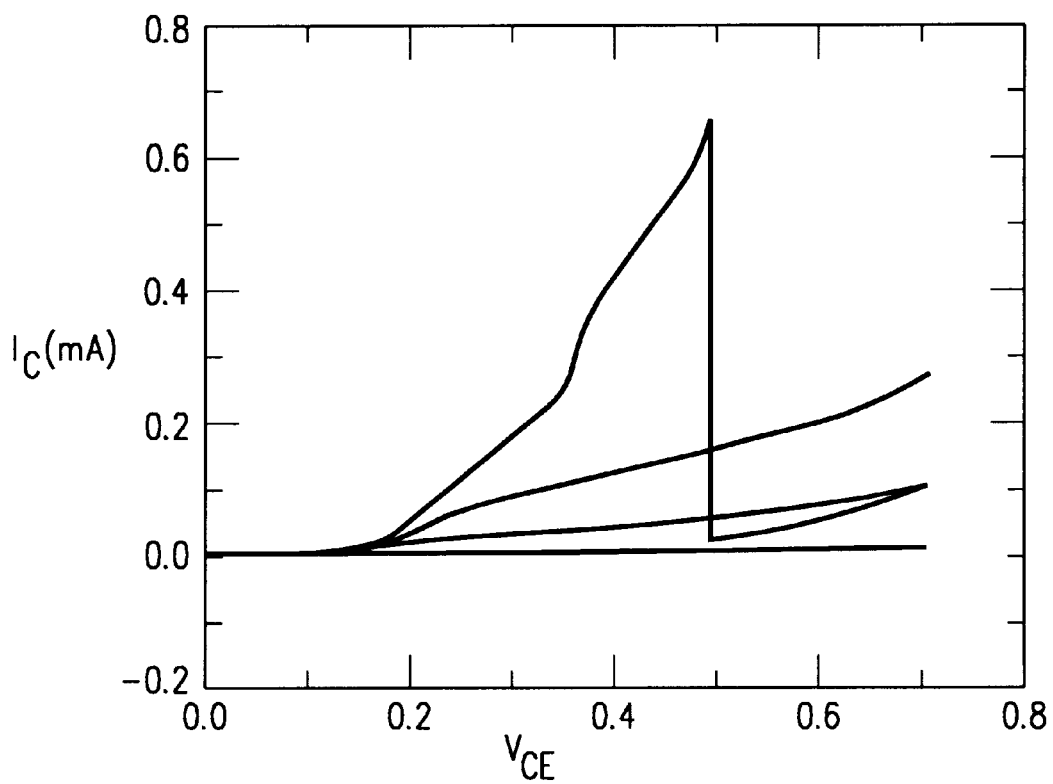

Shown in FIGS. 4a and 4b is the common emitter transistor characteristic for another 40 nanometer-base transistor at 4.2K, showing also the base/emitter voltage dependence on $V_{CE}$. A sharp increase in the conductance is observed at $V_{CE}$=300 mV for $I_B$=800 microamperes. This is explained by the energetic alignment of a resonant state within the quantum well base itself.

Figure 5:
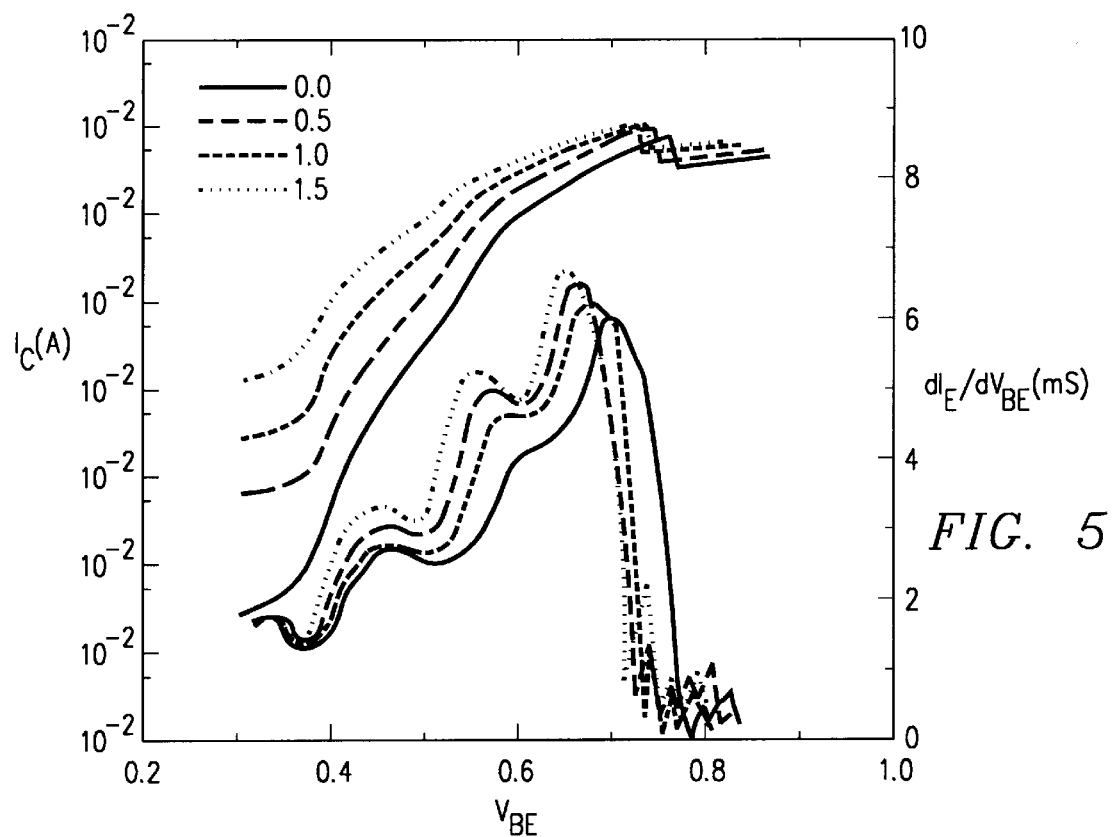
FIG. 5 is a graph of performance characteristics for a transistor according to the invention, showing the dependence of collector current and input conductance on $V_{BE}$.

It is possible to measure these transmission resonances through the quantum well by fixing the collector/base voltage and measuring the input conductance, $dI_E/dV_{BE}$, as a function of $V_{BE}$. Enhanced conductance occurs when the injected emitter electrons align with quantum well resonant states. This measurement is shown in FIG. 5, where collector current and device input conductance are plotted as a function of $V_{BE}$ for four values of collector/base voltage. Clear peaks in the conductance are observed with approximately 100 millivolt spacings. These are consistent with the calculated energy separations for the potential profile shown in FIG. 2. The magnitude of the conductance oscillations increases with increasing collector/base bias, which is consistent with an increase in the base transport factor due to more efficient collection of electrons at the base/collector junction.

Microwave Measurements

Figure 6:
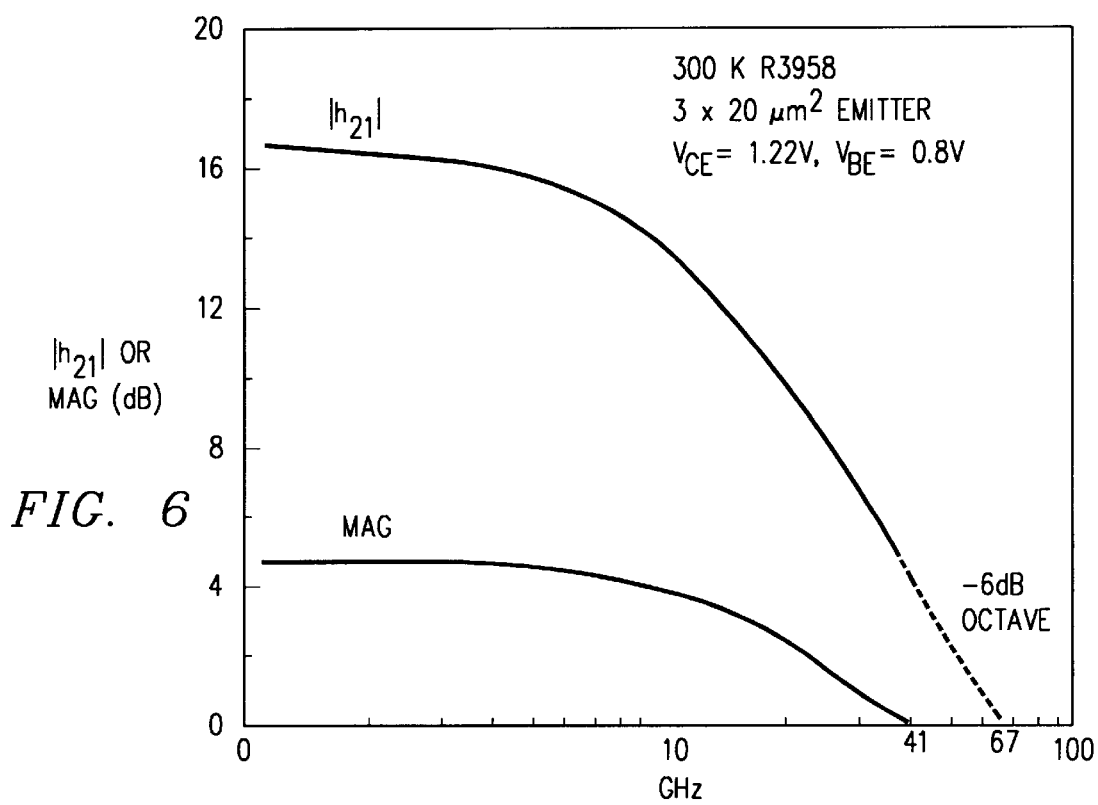
FIG. 6 is a graph of the S-parameter measurements of the microwave current gain, $H_{21}$, and maximum available gain as a function of frequency.

On-wafer S-parameter measurements were performed on the devices at room temperature using RF probes. Shown in FIG. 6 is a dependence of $h_{21}$ and the maximum available gain (MAG) on frequency for a 40 nanometer-wide-base transistor fabricated according to the invention. Extrapolating at −6 dB/octave, values for $f_T$=67 GHz and $f_{MAX}$=41 GHz are obtained. Measurements of a transistor fabricated according to the invention with a base 20 having width of 60 nanometers were also obtained, yielding an $f_T$ of 54 GHz and an $f_{MAX}$ of 11 GHz. The lower $f_T$ in the wider base transistor is attributed to a decrease in the base transport factor. The maximum available gain in these transistors could be further increased by reducing the base/collector leakage current, which in turn increases the output impedance of the transistor.

In summary, the first InP-based hot electron transistors to exhibit room-temperature DC gain of greater than ten have been described. Room temperature operation is attributed to the notched resonant tunnel diode injector, which lowers the energy of hot electrons injected into the base, and thereby reduces intervalley transfer.

While preferred embodiments of the invention have been shown and described in the above detailed description, the invention is not limited thereto, but only by the scope and spirit of the appended claims.

What is claimed is:

1. A hot carrier transistor, comprising:

(a) an emitter;

(b) a base;

(c) a collector, said collector forming a heterojunction with said base; and (d) an injector connected between said emitter and said base, said injector including tunneling barriers with bandgap larger than the bandgaps of said emitter and of said base and also including a quantum well between said tunneling barriers with a portion having a bandgap smaller than the bandgaps of said emitter and of said base.

2. The hot carrier transistor of claim 1, wherein:

(a) the common emitter current gain of said transistor is at least 10 at room temperature.

3. The hot carrier transistor of claim 1, wherein:

(a) said emitter is made of indium gallium arsenide;

(b) said base is made of indium gallum arsenide;

(c) said collector is made of indium aluminum gallium arsenide;

(d) said tunneling barriers are made of aluminum arsenide; and (e) said portion is made of indium arsenide.

4. The hot carrier transistor of claim 3, wherein:

(a) the dimensions of said injector yield a resonant energy level for electrons which is greater than the conduction band edge energy level of said collector and which is less than the X and L valley minima of the conduction band of said base.

* * * * *